United States Patent
Dang et al.

(10) Patent No.: US 12,076,833 B2
(45) Date of Patent: Sep. 3, 2024

(54) METHODS AND SYSTEMS FOR PROCESSING ONE OR MORE INTEGRATED CIRCUIT PROBES

(71) Applicant: Nidec Motor Corporation, St. Louis, MO (US)

(72) Inventors: Son N. Dang, Tempe, AZ (US); Jordan L Wahl, Mesa, AZ (US)

(73) Assignee: NIDEC SV PROBE PTE. LTD., Singapore (SG)

( * ) Notice: Subject to any disclaimer, the term of this patent is extended or adjusted under 35 U.S.C. 154(b) by 1022 days.

(21) Appl. No.: 17/018,720

(22) Filed: Sep. 11, 2020

(65) Prior Publication Data

US 2021/0078133 A1    Mar. 18, 2021

Related U.S. Application Data

(60) Provisional application No. 62/899,441, filed on Sep. 12, 2019.

(51) Int. Cl.
*B24B 49/04* (2006.01)
*B24B 9/00* (2006.01)
*B24B 19/16* (2006.01)
*G01R 1/067* (2006.01)

(52) U.S. Cl.
CPC ............ *B24B 49/045* (2013.01); *B24B 9/007* (2013.01); *B24B 19/165* (2013.01); *G01R 1/06711* (2013.01)

(58) Field of Classification Search
CPC .. B24B 3/26; B24B 3/32; B24B 3/605; B24B 49/045; B24B 9/007; B24B 41/067; B24B 19/165; B24B 19/16; G01R 1/06711; B24D 7/14; A61B 2017/00526
USPC ............................ 29/559, 33 F; 451/382, 909
See application file for complete search history.

(56) References Cited

U.S. PATENT DOCUMENTS

| | | | | |
|---|---|---|---|---|
| 1,287,224 | A | * | 12/1918 | Causey .................. B24B 37/30 369/71 |
| 3,539,314 | A | * | 11/1970 | Dery ...................... B24B 19/16 451/194 |
| 3,803,771 | A | | 4/1974 | Bunn |
| 3,975,865 | A | * | 8/1976 | Lewis ................... B24B 19/226 451/359 |
| 5,282,715 | A | * | 2/1994 | Abbate .................. B24B 41/06 414/757 |
| 5,476,480 | A | * | 12/1995 | Matsutani .............. B24B 19/16 606/222 |

(Continued)

FOREIGN PATENT DOCUMENTS

| | | |
|---|---|---|
| JP | 2005003516 A | 1/2005 |
| JP | 2009125913 A * | 6/2009 |

OTHER PUBLICATIONS

JP2009125913A English Translation (Year: 2009).*

*Primary Examiner* — Makena S Markman

(74) *Attorney, Agent, or Firm* — Stinson LLP

(57) ABSTRACT

A probe sanding fixture includes a base, a probe adapter including a probe guide defining one or more channels defined therein, and a sander tool including a sanding wheel and a gauge pin configured to process one or more probes positioned in the channels. The probe adapter is coupleable to the base such that the channels are extendable generally along a first axis. The sander tool is coupled to the base such that the sander tools is translatable along a second axis and rotatable about the first axis.

16 Claims, 7 Drawing Sheets

(56) References Cited

U.S. PATENT DOCUMENTS

| | | | | |
|---|---|---|---|---|
| 7,279,912 | B2* | 10/2007 | Leon | G01R 1/06738 |
| | | | | 324/755.11 |
| 8,026,734 | B2* | 9/2011 | Dang | G01R 1/06738 |
| | | | | 324/755.07 |
| 10,098,660 | B2* | 10/2018 | Park | A61B 17/3417 |
| 2005/0191952 | A1* | 9/2005 | Mitarai | B24D 11/04 |
| | | | | 451/314 |
| 2012/0295520 | A1 | 11/2012 | Aarts et al. | |
| 2013/0029528 | A1 | 1/2013 | Tamm | |

* cited by examiner

METHODS AND SYSTEMS FOR PROCESSING ONE OR MORE INTEGRATED CIRCUIT PROBES

CROSS-REFERENCE TO RELATED APPLICATION

This application claims the benefit of U.S. Provisional Application No. 62/899,441, filed Sep. 12, 2019.

BACKGROUND

At least some known test equipment include probes that may be used to apply test voltages to an integrated circuit (IC). To ensure good electrical connection between the test circuitry and the IC, the probes may be pressed on or moved across one or more surfaces at or proximate to the leads, pads, bumps, and/or lands of the IC. Over time, the probes may wear down and/or accumulate debris. However, at least some known methods and systems of replacing, maintaining, and/or cleaning probes are difficult, onerous, and/or time-consuming.

SUMMARY

Aspects of the disclosure enable one or more probes to be processed efficiently and effectively. In one aspect, a probe sanding fixture is provided. The probe sanding fixture includes a base, a probe adapter including a probe guide defining one or more channels defined therein, and a sander tool including a sanding wheel and a gauge pin configured to process one or more probes positioned in the channels. The probe adapter is coupleable to the base such that the channels are extendable generally along a first axis. The sander tool is coupled to the base such that the sander tool is translatable along a second axis and rotatable about the first axis.

In another aspect, a system is provided for use in processing one or more probes. The system includes a probe adapter including a probe guide defining one or more channels defined therein, a sanding wheel coupled to the probe adapter, and a gauge pin. The channels are extendable generally along a first axis. The sanding wheel is translatable along a second axis and rotatable about the first axis. The gauge pin extends along the first axis from the sanding wheel such that the gauge pin is configured to move as the sanding wheel is translated along the second axis and/or rotated about the first axis.

In yet another aspect, a method is provided for processing one or more probes. The method includes moving a probe guide defining one or more channels defined therein to a load position, extending one or more probes through the channels, moving the probe guide to a use position, moving a sander tool to a first position to process the probes using a sanding wheel, moving the sander tool to a second position to process the probes using a first surface of a gauge pin, and moving the sander tool to a third position to process the probes using a second surface of the gauge pin.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Features, aspects, and advantages of the present disclosure will become better understood when the following Detailed Description is read with reference to the accompanying drawings in which like reference characters represent like elements throughout, wherein.

Figure 1:
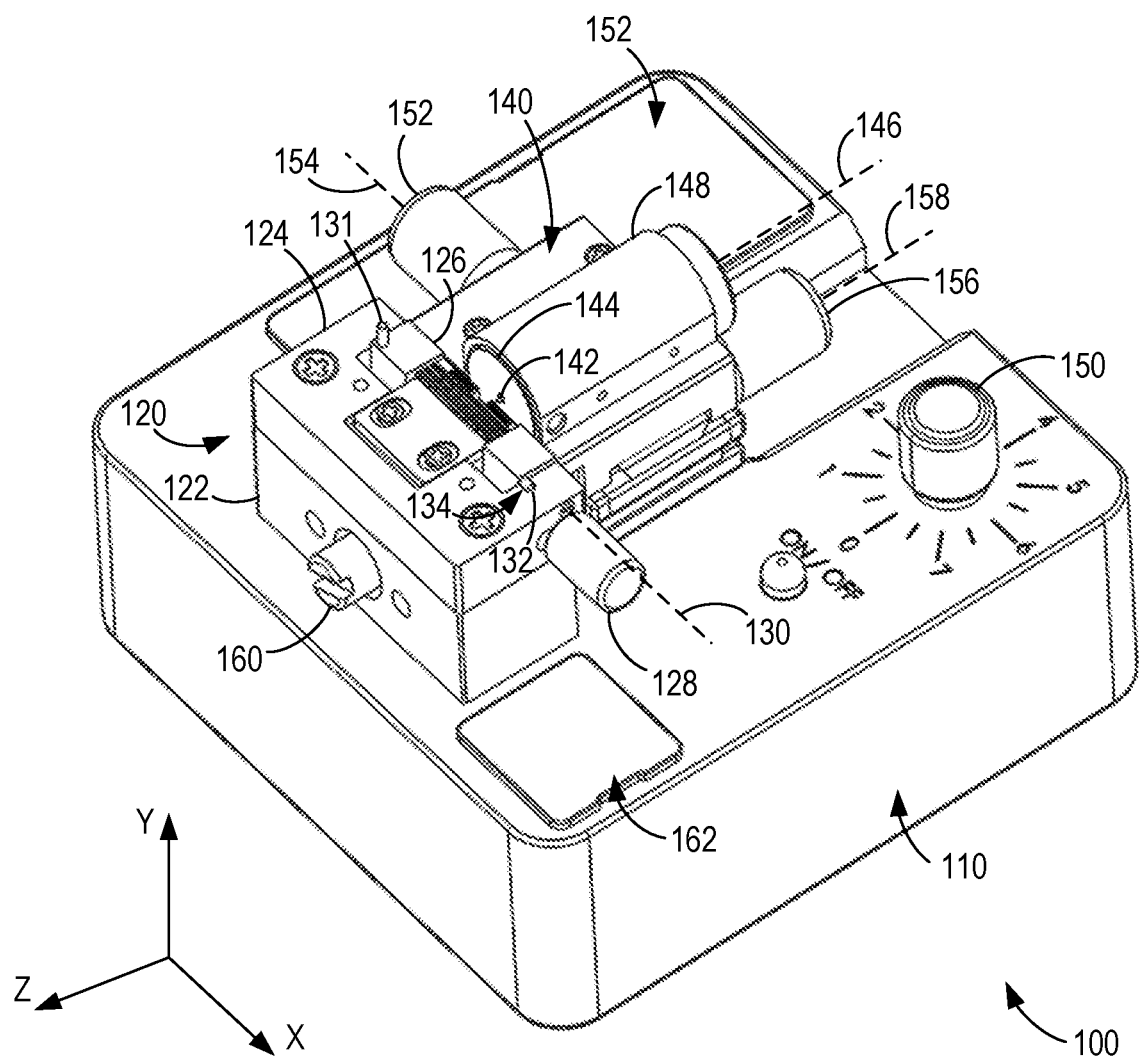
FIG. 1 is a perspective view of an example probe sanding fixture.

Although specific features of various examples may be shown in some drawings and not in others, this is for convenience only. Any feature of any drawing may be referenced and/or claimed in combination with any feature of any other drawing.

DETAILED DESCRIPTION

The subject matter described herein relates generally to test equipment used in semiconductor manufacturing, and more particularly to the maintenance and repair of test probes. Examples of the disclosure include a probe sander tool including a sander that sands a probe tail or tip to a desired length, a grinder that grinds the probe tail or tip to a desired shape and/or length, and a conditioner that conditions the probe tail or tip to a desired size, shape, and/or length.

Certain terminology is used in the present disclosure for convenience and reference only and not in a limiting sense. For example, the terms "lower," "upper," "downward," "upward," "above," "under," "vertical," "horizontal," and the like designate directions in relation to the perspective shown in the drawings. One of ordinary skill in the art would understand and appreciate that the example methods and systems described herein may be used in various orientations. Moreover, some "slots," "channels," "cavities," and "openings" described herein may be interpreted to include a rim portion, an edge, or other physical feature that defines such "slots," "channels," "cavities," and "openings."

FIG. 1 shows an example probe sanding fixture 100 including a base 110, a probe adapter 120 coupled to the base 110, and a sander tool 140 coupled to the base 110. In some examples, the probe adapter 120 includes a support block 122 coupled to the base 110, a seat 124 coupled to the support block 122, and a probe guide 126 moveably coupled to the seat 124. The seat 124 may be coupled to the support block 122 such that the seat 124 is securely positioned relative to the support block 122 and/or base 110. In some examples, the probe guide 126 is fabricated from one or more high-performance polymer materials exhibiting heat-resistance, lubricity, dimensional stability, chemical resistance, and/or creep resistance (for example, a VESPEL material; VESPEL is a trademark of DuPont Polymers, Inc. in Wilmington, Del.). The base 110 may include one or more storage portions 162 defining a cavity therein for use in storing one or more objects, such as a probe, a tool, and/or any other object that enables the probe sanding fixture 100 to function as described herein.

The probe guide 126 includes one or more slots or channels 201 (shown, for example, in FIG. 5) defined therein. The channels 201 may be sized and/or configured, for example, to receive one or more probes 202 (shown, for example, in FIG. 2). In some examples, the probe guide 126 includes one or more reference platforms or guide plates 204 (shown, for example, in FIG. 2) that facilitate positioning the probes 202 within the channels 201. The guide plates 204 may be configured to engage the probes 202. For example, the probes 202 may be positioned within the channels 201 such that a posterior end of the probes 202 (an end toward a negative Z-direction) abuts or contacts an anterior surface of the guide plate 204 (a surface facing a positive Z-direction). The guide plates 204 may include one or more hard materials, such as glass. In some examples, the probe guide 126 includes one or more biasing mechanisms (for example, springs) that urge the guide plates 204 in an anterior direction (in a positive Z-direction) while providing at least some "give" in a posterior direction (in a negative Z-direction). The guide plates 204 may have one or more slots or channels defined therethrough that are aligned with one or more channels 201 defined in the probe guide 126. The probe guide 126 and/or guide plate 204 may include or be coupled to a retaining mechanism or clamp (not shown) configured to secure the probes 202 within the channels 201. In some examples, one or more alignment pins are useable to position the clamp relative to the channels 201, and/or one or more lock screws are useable to secure the clamp in a desired position.

In some examples, the probe adapter 120 is coupleable to the base 110 such that the channels 201 are extendable generally in an anteroposterior direction (along the Z-axis). The probe guide 126 may be operably coupled to a control knob 128 configured to reciprocally move the probe guide 126 relative to the seat 124. The control knob 128 may be moved about a rotational axis 130 extending laterally (along the X-axis), for example, to selectively move the probe guide 126 between a use position (shown in FIGS. 1 and 4-9) and a load position (shown in FIGS. 2 and 3). In some examples, the probe guide 126 includes a grasp pin 131 that may be used to move the probe guide 126 relative to the seat 124. For example, a user may grasp the control knob 128 with one hand and grasp the grasp pin 131 with another hand for use in moving the probe guide 126.

In some examples, the probe adapter 120 includes a guide pin 132 that facilitates positioning the probe guide 126. For example, the guide pin 132 may be positioned in a slot 134 defined in an upper portion of the seat 124 (a portion toward a positive Y-direction) when the probe guide 126 is in the use position and out of the slot 134 when the probe guide 126 is in the load position.

Figure 2:
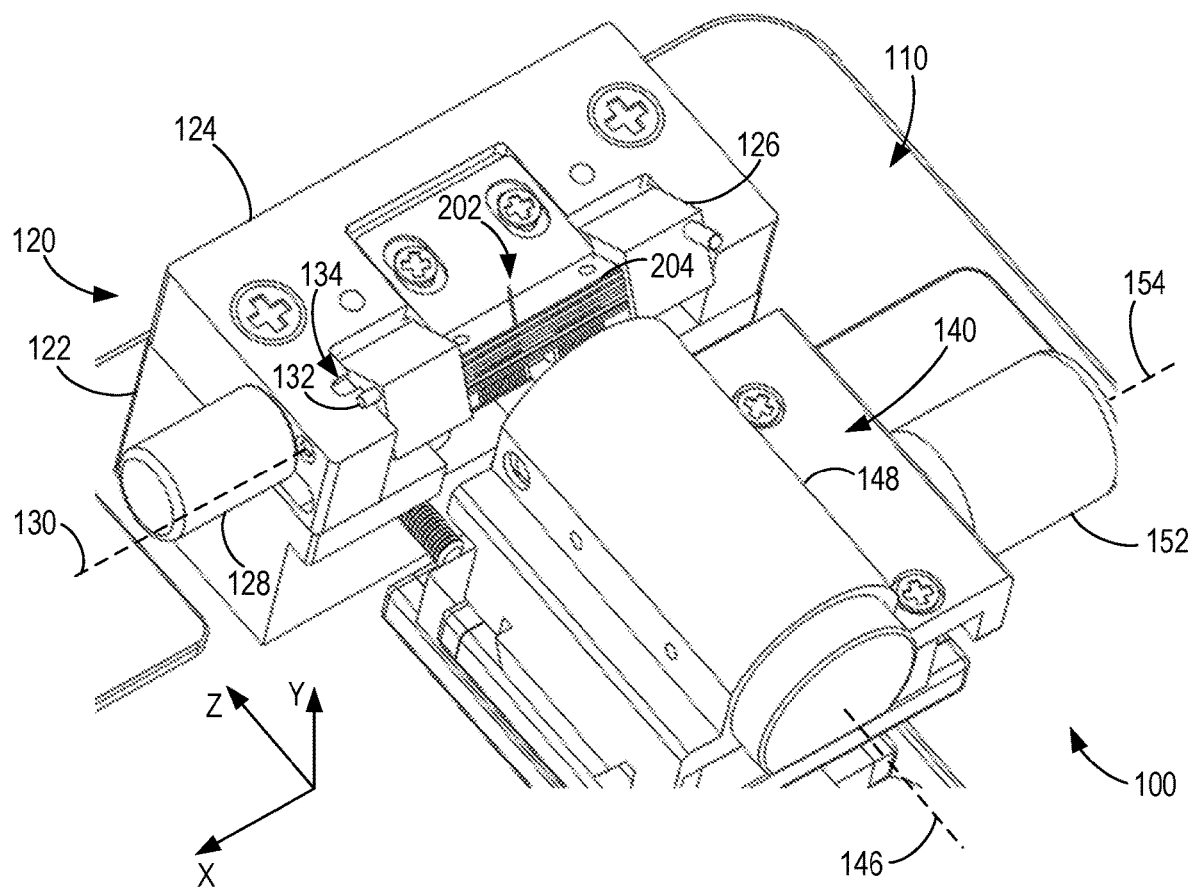
FIG. 2 is a perspective view of a portion of the probe sanding fixture shown in FIG. 1 in a first configuration.

In some examples, the sander tool 140 is configured to sand, grind, condition, or otherwise process one or more probes 202 (shown, for example, in FIG. 2). The sander tool 140 includes a gauge pin 142 and a sanding wheel 144 that generally face and/or are oriented in an anterior direction (toward a positive Z-direction). In this manner, the gauge pin 142 and/or sanding wheel 144 may face and/or be oriented toward the probe guide 126 when the probe guide 126 is in the use position. As shown in FIG. 1, the gauge pin 142 may extend longitudinally in an anterior direction (toward a positive Z-direction) from a radial center of the sanding wheel 144. In some examples, an anterior surface of the gauge pin 142 and/or sanding wheel 144 (a surface facing a positive Z-direction) includes one or more abrasive materials, such as diamond, aluminum oxide, carbide, silicon carbide, silicon oxide, cerium oxide, tungsten, ceramic, and the like. The gauge pin 142 and/or sanding wheel 144 are rotatable about a rotational axis 146 extending in an anteroposterior direction (along the Z-axis).

The sander tool 140 may include a motor 148 configured to rotate the sander tool 140 (including the gauge pin 142 and/or sanding wheel 144) about the rotational axis 146. In some examples, the motor 148 is operably coupled to a control knob 150 configured to actuate the motor 148. The control knob 150 may be used, for example, to turn the motor 148 on or off and/or adjust a rotational speed of the motor 148 for use in selectively rotating the gauge pin 142 and/or sanding wheel 144.

The sander tool 140 may be selectively positioned relative to the probe adapter 120 for processing the probes 202. In some examples, the sander tool 140 is translatable in a horizontal direction (for example, along the X-axis and/or the Z-axis). For example, a first control knob 152 may be rotated about a rotational axis 154 to move or translate the sander tool 140 in a lateral direction (along the X-axis), and a second control knob 156 may be rotated about a rotational axis 158 to move or translate the sander tool 140 in an anteroposterior direction (along the Z-axis). The probe sanding fixture 100 may include a lock or control knob 160 that may be used to lock or secure a position of the sander tool 140 with respect to the Z-axis.

Figure 3:
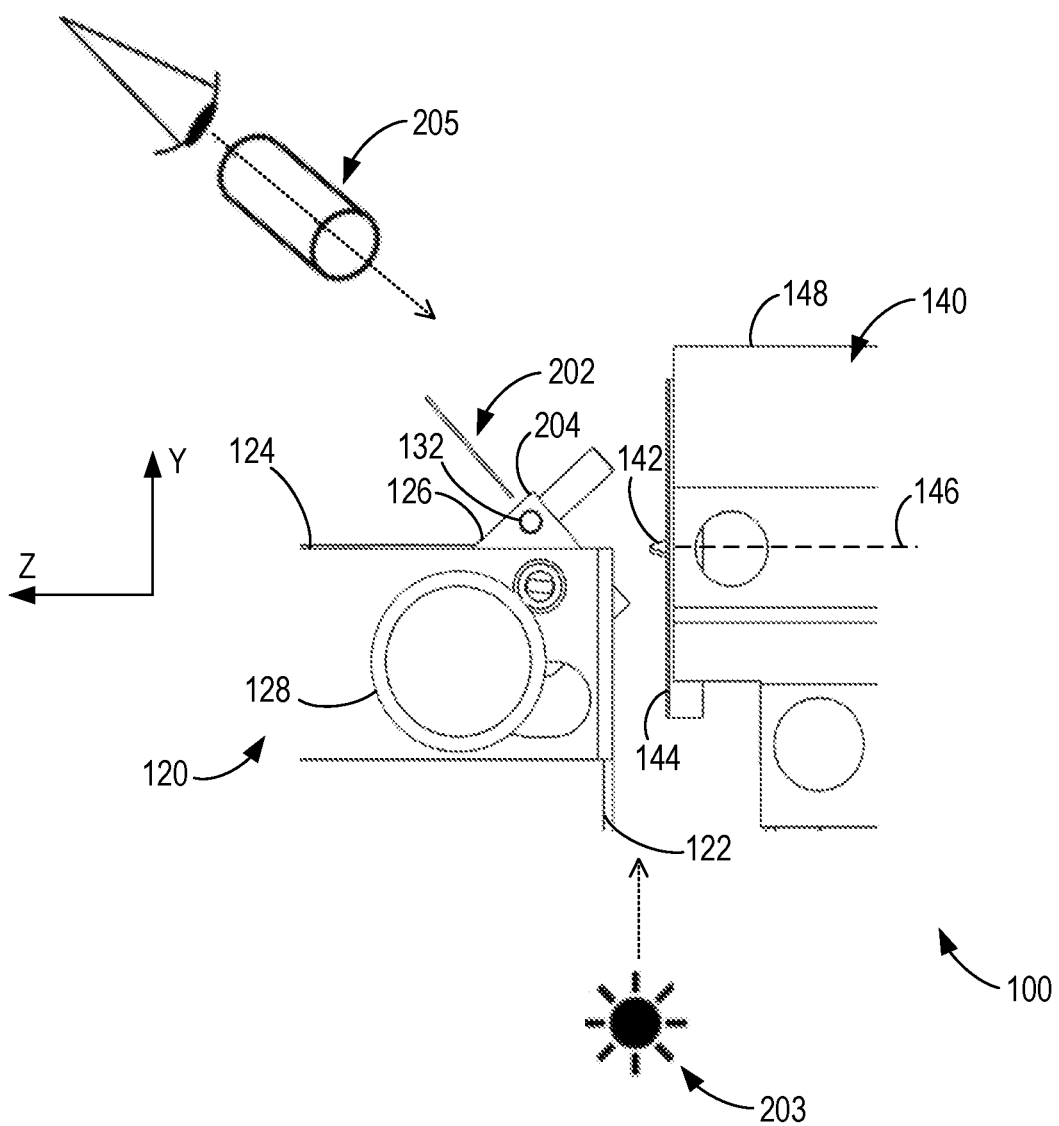
FIG. 3 is a detailed side view of a portion of the probe sanding fixture shown in FIG. 1 in the first configuration.

FIGS. 2 and 3 show the probe sanding fixture 100 in a loading configuration. When the probe sanding fixture 100 is in the loading configuration, the probe guide 126 is in the load position to enable one or more probes 202 to be loaded into the probe guide 126. In some examples, the probe sanding fixture 100 is selectively moved towards the loading configuration using the control knob 128. The control knob 128 may be moved within a slot defined in the seat 124 in a clockwise direction about the rotational axis 130, for example, such that an anterior surface of the probe guide 126 (a surface facing a positive Z-direction) is exposed or accessible. For example, as shown in FIGS. 2 and 3, an upper portion of the probe guide 126 (a portion toward a positive Y-direction) may be rotated backward (toward a negative Z-direction) and/or a lower portion of the probe guide 126 (a portion toward a negative Y-direction) may be rotated forward (toward a positive Z-direction) approximately 45 degrees such that the channels 201 of the probe guide 126 extend diagonally and/or an anterior end of the channels 201 (an end toward a positive Z-direction) are spaced from a posterior surface of the seat 124 (a surface facing a negative Z-direction). In some examples, the guide pin 132 is free from the slot 134 when the probe guide 126 is in the load position.

When the probe sanding fixture 100 is in the loading configuration, one or more probes 202 may be loaded into the probe guide 126 through one or more openings at the anterior end of the channels 201. The probe guide 126 is configured to receive probes 202 of varying lengths (for example, from a plurality of bins) in the channels 201. In some examples, the probe sanding fixture 100 includes or is coupled to a light source 203 (for example, a light emitting diode or LED, shown in FIG. 3) oriented to illuminate the probes 202 when the probes 202 are in the channels 203 of the probe guide 126 to facilitate monitoring of the shaping process through an external microscope 205 (shown in FIG. 3).

Figure 4:
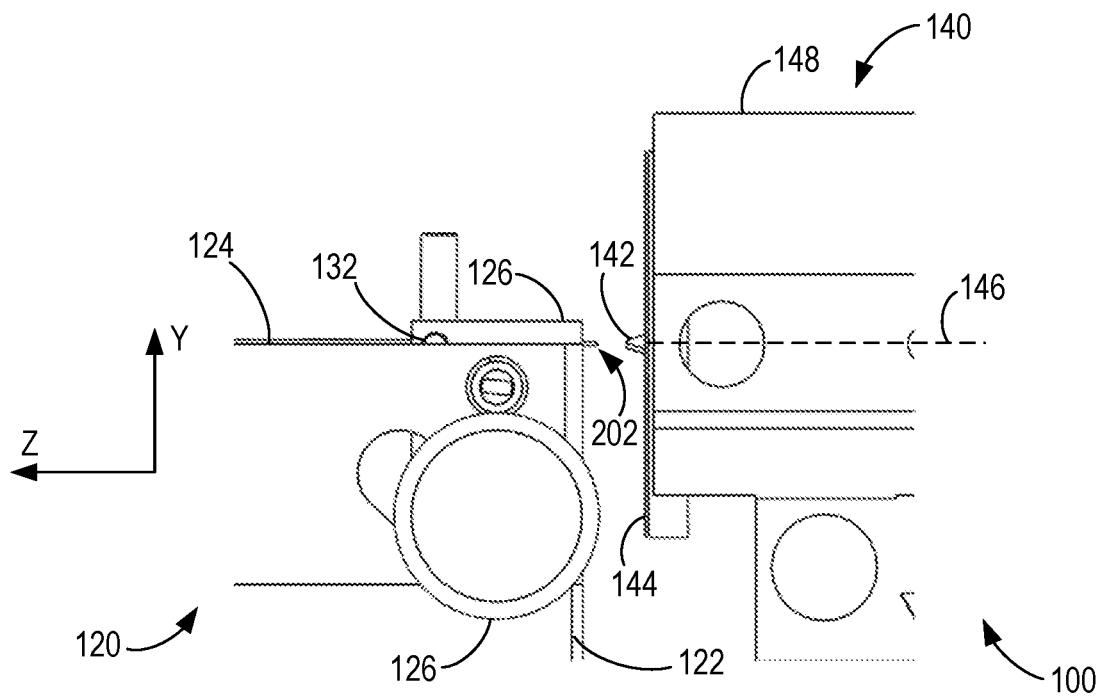
FIG. 4 is a detailed side view of a portion of the probe sanding fixture shown in FIG. 1 in a second configuration.
Figure 5:
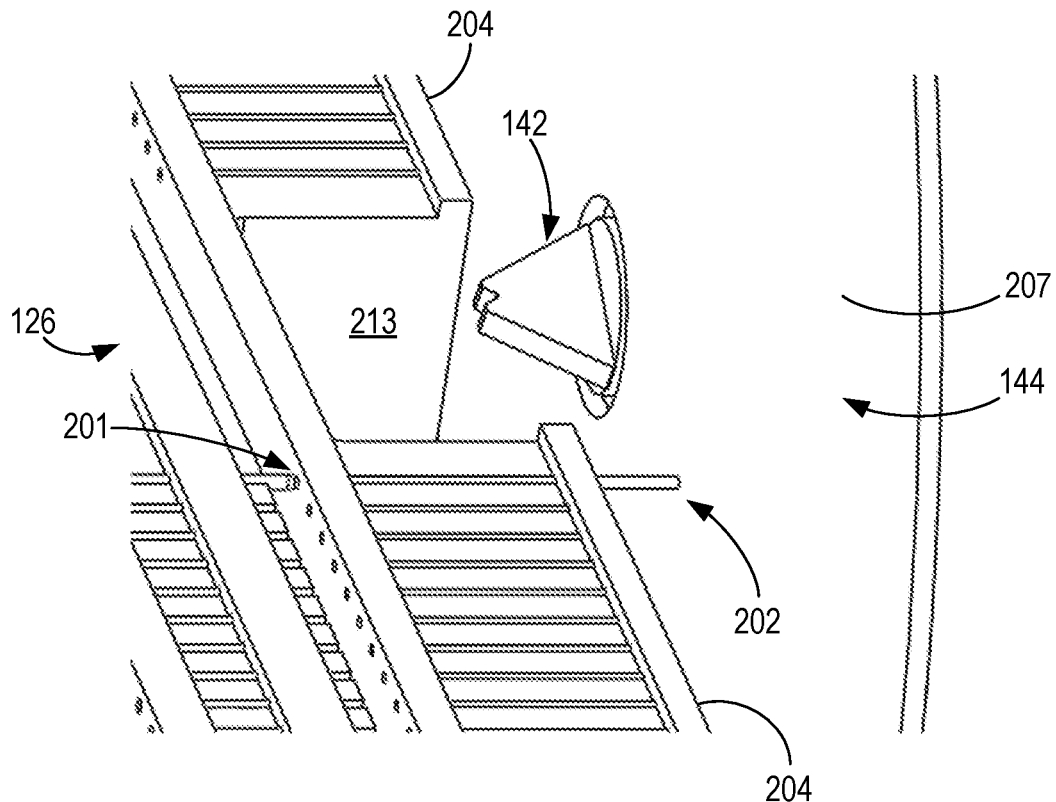
FIG. 5 is a detailed perspective view of a portion of the probe sanding fixture shown in FIG. 1 in the second configuration.

FIGS. 4 and 5 show the probe sanding fixture 100 in a sanding configuration. When the probe sanding fixture 100 is in the sanding configuration, the probe guide 126 is in the use position to enable the sander tool 140 to process one or more probes 202 loaded in the probe guide 126. In some examples, the probe sanding fixture 100 is moved towards the sanding configuration using the control knob 128. The control knob 128 may be moved within the slot defined in the seat 124 in a counterclockwise direction about the rotational axis 130, for example, such that an anterior surface of the probe guide 126 (a surface facing a positive Z-direction) faces a posterior surface of the seat 124 (a surface facing a negative Z-direction) and/or a posterior surface of the probe guide 126 (a surface facing a negative Z-direction) faces an anterior surface of the sanding wheel 144 (a surface facing a positive Z-direction). As shown in FIG. 4, when the probe guide 126 is in the use position, the probe guide 126 may be oriented such that the channels 201 of the probe guide 126 extend in an anteroposterior direction (along the Z-axis).

In some examples, a probe 202 is positionable such that a posterior end (an end toward a negative Z-direction) extends longitudinally beyond a posterior surface of the probe guide 126 (an surface facing a negative Z-direction). When the probe sanding fixture 100 is in the sanding configuration, the sander tool 140 is positionable relative to the probe guide 126 such that the sanding wheel 144 may selectively engage one or more probes 202 extending longitudinally beyond the posterior surface of the probe guide 126. In some examples, the sanding wheel 144 includes a first lapping film 207 (shown in FIG. 5) with a first grade at its anterior surface (a surface facing a positive Z-direction) for use in sanding. In this manner, the sanding wheel 144 may be used to sand down the probes 202 to a desired length, which may be the same as or different than that of other probes 202. In some examples, when the probe sanding fixture 100 is in the sanding configuration, the sander tool 140 is positionable relative to the probe guide 126 such that the gauge pin 142 extends into a recess portion 213 (shown in FIG. 5) of the probe guide 126 to facilitate positioning the sanding wheel 144 in contact with the probe 202.

In some examples, the first control knob 152 is used to selectively position the sanding wheel 144 laterally along the X-axis, the second control knob 156 is used to selectively position the sanding wheel 144 anteroposteriorly along the Z-axis, and/or the control knob 150 is used to actuate the motor 148 for selectively rotating the sanding wheel 144 about the rotational axis 146.

Figure 6:
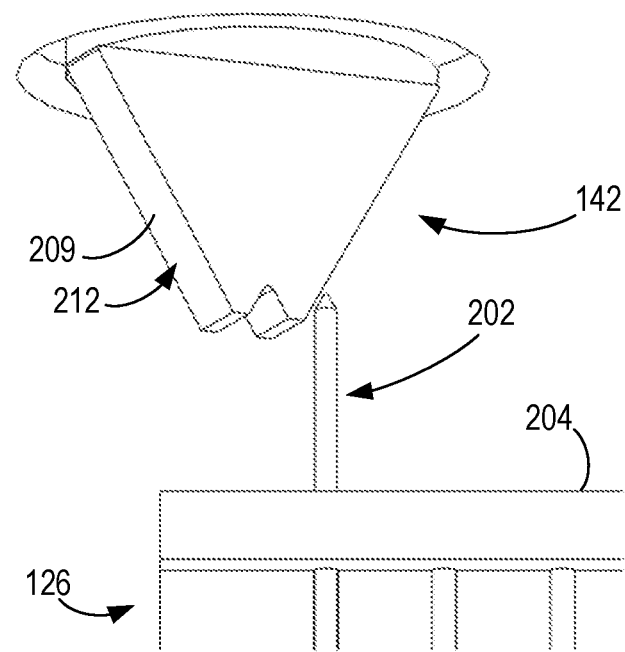
FIG. 6 is a detailed perspective view of a portion of the probe sanding fixture shown in FIG. 1 in a third configuration.
Figure 7:
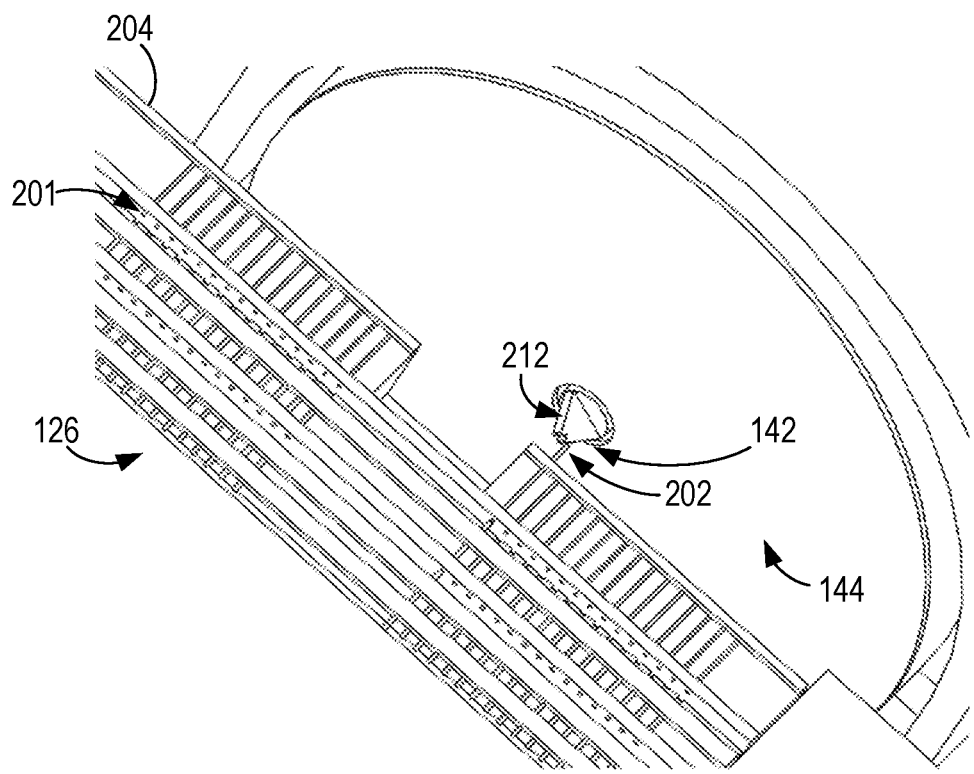
FIG. 7 is a detailed side view of a portion of the probe sanding fixture shown in FIG. 1 in the third configuration.

FIGS. 6 and 7 show the probe sanding fixture 100 in a grinding configuration. When the probe sanding fixture 100 is in the grinding configuration, the probe guide 126 is in the use position to enable the sander tool 140 to process one or more probes 202 loaded in the probe guide 126, and the sander tool 140 is positionable relative to the probe guide 126 such that the gauge pin 142 may selectively engage one or more probes 202 extending longitudinally beyond the posterior surface of the probe guide 126. In some examples, the gauge pin 142 includes a second lapping film 209 (shown in FIG. 6) with a second grade different from the first grade at its anterior surface (a surface facing a positive Z-direction) for use in grinding. In this manner, the probes 202 may be grinded down to a desired length and/or shape, which may be the same as or different than that of other probes 202.

In some examples, the anterior surface of the gauge pin 142 (a surface facing a positive Z-direction) includes a plurality of portions such that the second lapping film 209 may be at a first portion of the anterior surface for use in grinding and a third lapping film 211 (shown in FIG. 8) with a third grade different from the first grade and/or the second grade may be at a second portion of the anterior surface for use in conditioning. The second lapping film 209 may be at a radially outer portion 212 of the anterior surface (for example, at one or more beveled edges). In such an example, the sander tool 140 may be positioned such that the radially outer portion 212 of the gauge pin 142 engages the probes 202. In this manner, the radially outer portion 212 may be used to remove material from the probes 202 to create a chamfered or pointed tip with an included angle that can vary, including, but not limited to, approximately 20-80° (for example, approximately 30-60°). Other angled tips may be formed by the gauge pin 142.

In some examples, the first control knob 152 is used to selectively position the gauge pin 142 laterally along the X-axis, the second control knob 156 is used to selectively position the gauge pin 142 anteroposteriorly along the Z-axis, and/or the control knob 150 is used to actuate the motor 148 for selectively rotating the gauge pin 142 about the rotational axis 146.

Figure 8:
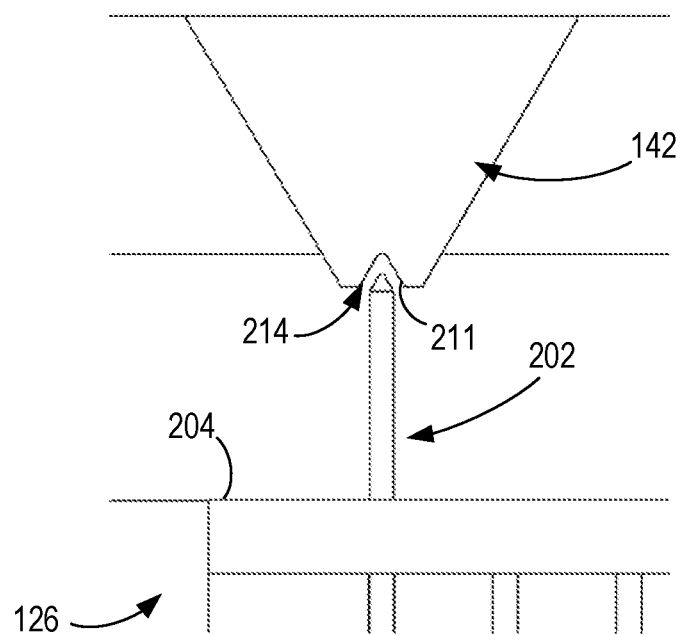
FIG. 8 is a detailed perspective view of a portion of the probe sanding fixture shown in FIG. 1 in a fourth configuration.
Figure 9:
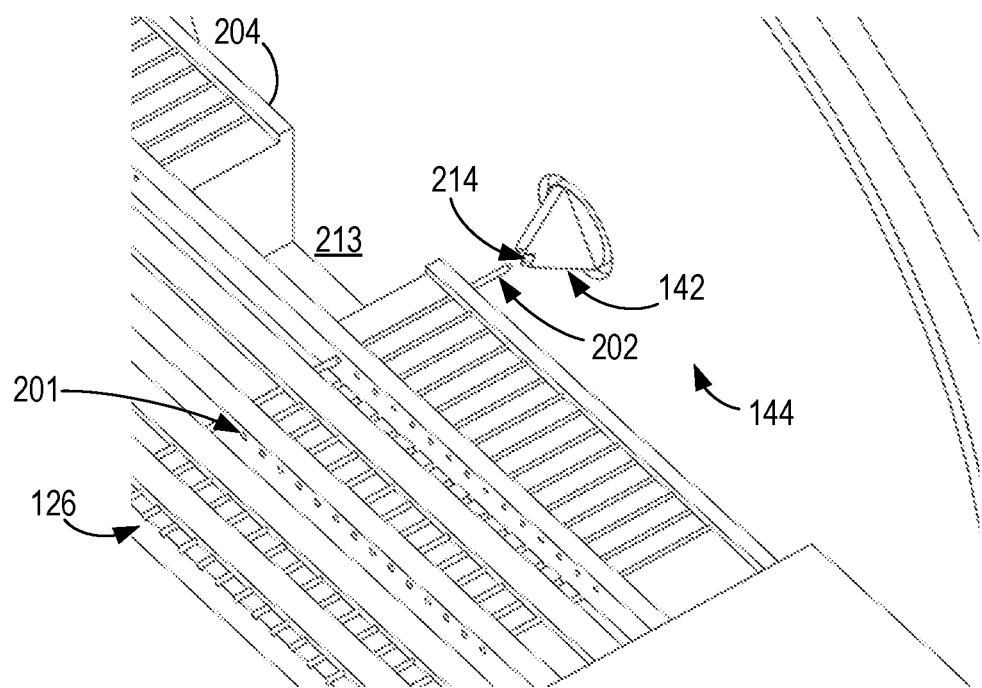
FIG. 9 is a detailed side view of a portion of the probe sanding fixture shown in FIG. 1 in the fourth configuration.

FIGS. 8 and 9 show the probe sanding fixture 100 in a conditioning configuration. When the probe sanding fixture 100 is in the conditioning configuration, the probe guide 126 is in the use position to enable the sander tool 140 to process one or more probes 202 loaded in the probe guide 126, and the sander tool 140 is positionable relative to the probe guide 126 such that the gauge pin 142 may selectively engage one or more probes 202 extending longitudinally beyond a posterior surface of the probe guide 126 (an surface facing a negative Z-direction). As described above, the gauge pin 142 may include a third lapping film 211 with a third grade different from the first grade and/or second grade at its anterior surface (a surface facing a positive Z-direction) for use in conditioning. In this manner, the probes 202 may be conditioned, sharpened, and/or modified to a desired length, shape, and/or size, which may be the same as or different than that of other probes 202.

In some examples, the third lapping film 211 is at a radially inner portion 214 of the anterior surface (for example, at one or more surfaces of an inverted V-shaped notch defined in an anterior, bevel end of the gauge pin 142). As shown in FIGS. 8 and 9, the inverted V-shaped notch may form an angle of approximately 45 degrees, for example. In such examples, the sander tool 140 may be positioned such that the radially inner portion 214 of the gauge pin 142 engages the probes 202.

In some examples, the first control knob 152 is used to selectively position the gauge pin 142 laterally along the X-axis, the second control knob 156 is used to selectively position the gauge pin 142 anteroposteriorly along the Z-axis, and/or the control knob 150 is used to actuate the motor 148 for selectively rotating the gauge pin 142 about the rotational axis 146.

Figure 10:
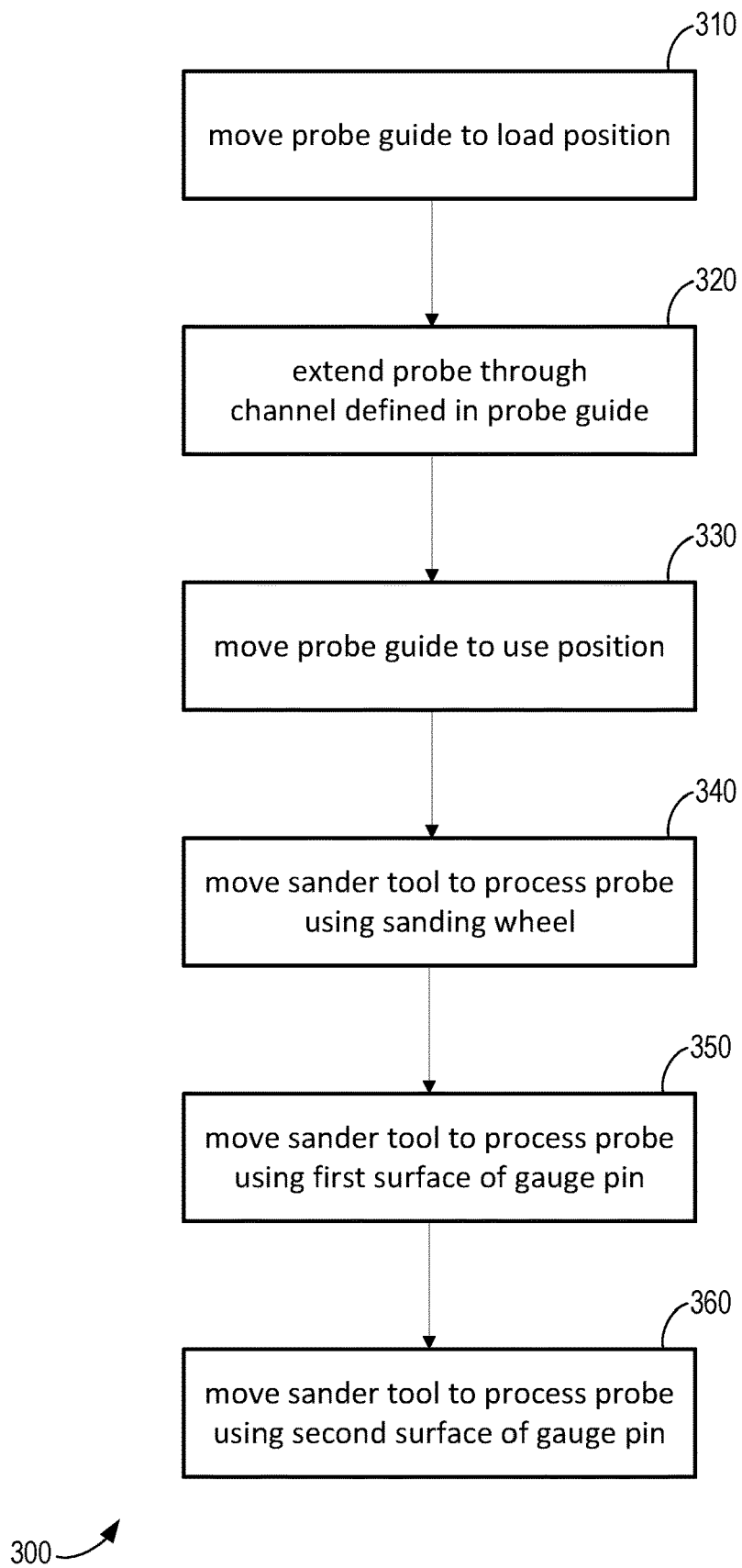
FIG. 10 is a flowchart of an example method of processing one or more probes.

FIG. 10 shows various operations of a method 300 that may be implemented to process one or more probes 202. The method 300 may be implemented using the probe sanding fixture 100, for example.

In some examples, a probe guide 126 is moved to a load position at operation 310. The probe guide 126 may be moved using a control knob 128, for example. In some examples, the probe guide 126 is moveably coupled to a seat 124 and/or support block 122. The probe guide 126 includes one or more slots or channels 201 defined therein for receiving one or more probes 202. The probes 202 may be extended through the channels 201 of the probe guide 126 at operation 320.

The probe guide 126 is moved to a use position at operation 330. The probe guide 126 may be moved, for example, such that the channels 201 extend longitudinally generally along a first axis (for example, the Z-axis). A sander tool 140 is moved to a first position at operation 340 to process the probes 202 using a sanding wheel 144. The sanding wheel 144 may be used to sand down the probes 202 to a desired length. That is, a segment of the probes 202 (for example, a segment toward a negative-Z direction) may be removed using the sander tool 140. In some examples, the sanding wheel 144 includes a first lapping film 207 with a first grade for use in sanding. The sanding wheel 144 may be moved toward the first position using a first control knob 152 for movement along a second axis (for example, the X-axis) and/or a second control knob 156 for movement along the first axis. In some examples, a lock or control knob 160 is used to lock or secure a position of the sanding wheel 144 with respect to the first axis.

The sander tool 140 is moved to a second position at operation 350 to process the probes 202 using a grinding blade at a first portion of a gauge pin 142 (for example, radially outer portion 212). The gauge pin 142 may be used to grind down the probes 202 to a desired length and/or shape. For example, a probe tip may be chamfered to form a conical tip or a frustoconical tip. Alternatively, the probe tip may be conditioned to form a radius tip or a rounded tip. In some examples, the grinding blade of the gauge pin 142 has a lapping film with a grinding grade (for example, second lapping film 209).

The gauge pin 142 may extend longitudinally from a surface of the sanding wheel 144 such that the gauge pin 142 is configured to move as the sanding wheel 144 is translated along the first axis and/or second axis and/or is rotated about the first axis. In this manner, the gauge pin 142 may be moved toward the second position using the first control knob 152 for lateral movement along the second axis and/or the second control knob 156 for movement along the first axis.

The sander tool 140 is moved to a third position at operation 360 to process the probes 202 using a conditioning surface at a second portion of the gauge pin 142 (for example, radially inner portion 214). The gauge pin 142 may be used to condition, sharpen, and/or otherwise modify the probes 202 to a desired length, shape, and/or size. For example, a probe tip may be conditioned to form a tip having a desired width or diameter (for example, a point tip or a flat tip). In some examples, the conditioning surface of the gauge pin 142 has a lapping film with a conditioning grade (for example, third lapping film 211).

Examples described herein enable probe tips and/or probe tails to be removed, shaped, and/or conditioned with precision and accuracy. For example, the probe sanding fixture 100 may be used to remove approximately 0.010 mm from a probe 202 and/or form a tip contact width of approximately 0.008 mm.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the disclosure.

Examples described herein include fixture design use for probe replacement. Probe tips and tails may be sanded to correspond to the current probe dimensions in an efficient and effective manner Probe sanding and tip conditioning may be performed using a probe sanding fixture. Features include sanding a probe tail to a desired length, sanding a probe tip to a desired length, and conditioning a probe tip.

When introducing elements of aspects of the disclosure or the embodiments thereof, the articles "a," "an," "the," and "said" are intended to mean that there are one or more of the elements. Furthermore, references to an "embodiment" or "example" of the present disclosure are not intended to be interpreted as excluding the existence of additional embodiments or examples that also incorporate the recited features. The terms "comprising," "including," and "having" are intended to be inclusive and mean that there may be additional elements other than the listed elements. The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, systems, and methods without departing from the scope of aspects of the disclosure, it is intended that all matter contained in the above description and shown in the accompanying drawings shall be interpreted as illustrative and not in a limiting sense.

While the aspects of the disclosure have been described in terms of various examples with their associated operations, a person skilled in the art would appreciate that a combination of operations from any number of different examples is also within the scope of the aspects of the disclosure.

What is claimed is:

1. A probe sanding fixture comprising:
 a base;
 a probe adapter including a probe guide defining one or more channels defined therein, the probe adapter coupleable to the base such that the one or more channels are extendable along a first direction;
 a sander tool including a sanding wheel and a gauge pin configured to process one or more probes, each of the one or more probes configured to be positioned in each of the one or more channels, the sander tool coupled to the base such that the sanding wheel and gauge pin of the sander tool are rotatable about a first axis and translatable along a second axis, the first axis extending along the first direction;
 wherein the gauge pin extends along the first axis toward the probe adapter from a radial center of the sanding wheel, the gauge pin includes an inverted V-shaped notch on an end of the gauge pin distal from the sanding wheel, the inverted V-shaped notch comprising a radially interior portion and a radially outer portion;
 wherein the sanding wheel includes a first lapping film with a first grade, the radially outer portion including a second lapping film with a second grade that is different from the first grade, the radially interior portion including a third lapping film with a third grade that is different from both the first grade and the second grade; and
 wherein the second grade is a grinding grade and the third grade is a conditioning grade.

2. The probe sanding fixture of claim 1, wherein the probe adapter includes a support block, and a seat coupleable to the support block, the probe guide moveably coupled to the seat.

3. The probe sanding fixture of claim 1, wherein the probe guide is moveable between a use position and a load position.

4. The probe sanding fixture of claim 1, wherein the probe adapter includes a slot defined therein and a guide pin positionable in the slot.

5. The probe sanding fixture of claim 1, wherein the sander tool includes a motor configured to rotate the sander tool about the first axis.

6. The probe sanding fixture of claim 1, wherein the sander tool is translatable along the first axis.

7. The probe sanding fixture of claim 1, wherein the probe adapter includes a lock configured to secure a position of the sander tool with respect to the first axis.

8. The probe sanding fixture of claim 1, wherein the base includes a storage portion defining a cavity therein.

9. The probe sanding fixture of claim 1, wherein the probe guide includes one or more guide plates configured to engage the one or more probes positioned in the one or more channels.

10. A system for use in processing one or more probes, the system comprising:
    a base;
    a probe adapter including a probe guide defining one or more channels defined therein, each of the one or more channels configured to receive each of one or more probes therein, the probe adapter coupleable to the base such that the one or more channels are extendable along a first direction;
    a sanding wheel coupled to the probe adapter, the sanding wheel is rotatable about a first axis and translatable along a second axis, the first axis extends along the first direction;
    a gauge pin extending along the first axis from a radial center of the sanding wheel such that the gauge pin is configured to move with the sanding wheel as the sanding wheel is one or more of translated along the second axis or rotated about the first axis;
    wherein the gauge pin includes an inverted V-shaped notch on an end of the gauge pin distal from the sanding wheel, the inverted V-shaped notch comprising a radially outer portion and a radially interior portion;
    wherein the sanding wheel includes a first lapping film with a first grade, the radially outer portion including a second lapping film with a second grade that is different from the first grade, and the radially interior portion including a third lapping film with a third grade that is different from both the first grade and the second grade; and
    wherein the second grade is a grinding grade and the third grade is a conditioning grade.

11. The system of claim 10, wherein the probe adapter includes a support block, and a seat coupleable to the support block, the probe guide moveably coupled to the seat.

12. The system of claim 10, wherein the probe guide is moveable between a use position and a load position.

13. The system of claim 10, wherein the probe adapter includes a slot defined therein and a guide pin positionable in the slot.

14. The system of claim 10, further comprising a motor configured to rotate the sanding wheel and the gauge pin about the first axis.

15. The system of claim 10, wherein the sanding wheel and gauge pin are translatable along the first axis.

16. A method of processing one or more probes, the method comprising:
    moving a probe guide to a load position, the probe guide defining one or more channels defined therein;
    extending the one or more probes through the one or more channels;
    moving the probe guide to a use position such that the one or more channels extend along a first direction;
    providing a sander tool including a sanding wheel and a gauge pin configured to process the one or more probes, the sanding wheel and gauge pin are rotatable about a first axis and translatable along a second axis, the first axis extending along the first direction;
    moving the sander tool to a first position to process a first probe of the one or more probes using a lapping surface of the sanding wheel;
    processing the first probe using the lapping surface of the sanding wheel, the lapping surface including a first grade;
    moving the sander tool to a second position to process the first probe using the gauge pin, the gauge pin extending along the first axis toward the probe guide from a radial center of the sanding wheel, the gauge pin including an inverted V-shaped notch on an end of the gauge pin distal from the sanding wheel, the inverted V-shaped notch comprising a radially outer portion comprising a first surface and a radially interior portion comprising a second surface;
    processing the first probe using the first surface, the first surface including a second grade;
    moving the sander tool to a third position to process the first probe using the second surface, the second surface including a third grade, wherein the second grade is different from the first grade and the third grade is different from both the first grade and the second grade, the second grade is a grinding grade and the third grade is a conditioning grade; and
    processing the first probe using the second surface.

\* \* \* \* \*